United States Patent
Mitchem et al.

(10) Patent No.: US 10,365,315 B2
(45) Date of Patent: Jul. 30, 2019

(54) MAPPING OF METALLIC CONDUCTORS BY APPLYING RADAR IMAGING TECHNIQUES TO SPREAD SPECTRUM TIME DOMAIN REFLECTOMETRY RETURNS

(71) Applicant: Southern California Edison, Westminster, CA (US)

(72) Inventors: Sean Mitchem, Helotes, TX (US); Jake Casey-Snyder, San Antonio, TX (US); Ben Abbott, San Antonio, TX (US); Yaxi Liu, Helotes, TX (US); Christopher M. Huff, Long Beach, CA (US); Bryan Pham, Cypress, CA (US)

(73) Assignee: Southern California Edison, Westminster, CA (US)

( * ) Notice: Subject to any disclaimer, the term of this patent is extended or adjusted under 35 U.S.C. 154(b) by 0 days.

(21) Appl. No.: 15/594,533

(22) Filed: May 12, 2017

(65) Prior Publication Data
US 2018/0328976 A1    Nov. 15, 2018

(51) Int. Cl.
*G01R 31/11*    (2006.01)
*G01R 31/08*    (2006.01)

(52) U.S. Cl.
CPC ............ *G01R 31/11* (2013.01); *G01R 31/085* (2013.01)

(58) Field of Classification Search
CPC ... G01R 31/005–31/008; G01R 31/021; G01R 31/08–31/11; H02S 50/10; H02S 50/15; G05F 1/66; G01B 7/026
See application file for complete search history.

(56) References Cited

U.S. PATENT DOCUMENTS

| | | | | |
|---|---|---|---|---|
| 5,650,728 A | * | 7/1997 | Rhein | G01R 31/021 324/534 |
| 2004/0189317 A1 | * | 9/2004 | Borchert | G01R 31/085 324/512 |
| 2005/0040809 A1 | * | 2/2005 | Uber, III | G01R 15/142 324/117 R |
| 2008/0106241 A1 | * | 5/2008 | Deaver | H02J 3/1828 323/209 |
| 2010/0283479 A1 | * | 11/2010 | McCormack | G01R 31/11 324/543 |

(Continued)

*Primary Examiner* — Huy Q Phan
*Assistant Examiner* — David B Frederiksen
(74) *Attorney, Agent, or Firm* — Jeffrey G. Sheldon; Katherine B. Sales; Cislo & Thomas LLP (57) ABSTRACT

A method for locating an anomaly in a distribution circuit including utility power lines includes coupling a radio frequency energy source to the utility power lines, transmitting chirped radio frequency signals into the utility power lines, receiving and digitizing/analyzing signals reflected from the chirped signals by impedance mismatches caused by components and features of the distribution circuit, and generating from the digitized signals of multiple sets of the chirped radio frequency signals a reference data set identifying at least the locations of at least some of the components and features of the distribution circuit. Later sets of the chirped radio frequency signals are transmitted into the utility power lines and signals reflected from the sets of chirped signals are received and digitized and are compared with the reference data set to determine if there are anomalies on the distribution circuit.

13 Claims, 6 Drawing Sheets

(56) References Cited

U.S. PATENT DOCUMENTS

| | | | |
|---|---|---|---|
| 2015/0236643 A1* | 8/2015 | Khan | H02S 50/15 702/58 |
| 2016/0141879 A1* | 5/2016 | Motsenbocker | G05F 1/67 307/18 |
| 2017/0176511 A1* | 6/2017 | Moell | G01R 31/086 |
| 2017/0199235 A1* | 7/2017 | Jeon | G01R 31/021 |

* cited by examiner

MAPPING OF METALLIC CONDUCTORS BY APPLYING RADAR IMAGING TECHNIQUES TO SPREAD SPECTRUM TIME DOMAIN REFLECTOMETRY RETURNS

BACKGROUND

The present invention relates to electrical power distribution system. More particularly, the present invention relates to an anomaly detection system using RF technology such as Spread-Spectrum Time-Domain reflectometry (SSTDR) techniques that can identify anomaly (high) impedances that represent faults on electrical distribution circuit and determine where they are occurring.

Incidental high-impedance faults are not currently detected and isolated by conventional means, such as overcurrent relays and fuses, and represent a hazard to unsuspecting bystanders and utility workers. Incidental faults have been shown to occur at a rate of one fault per utility power line every four years. High-impedance faults have a higher occurrence probability in longer distribution circuits.

There are high-impedance fault detection systems that use passive sensing devices to measure the primary voltage, current, and harmonics for power distribution circuits. Some of the available devices can detect a broken utility power line by measuring the current drop on a utility power line. Other available devices are able to detect an arcing event (e.g., a utility power line coming into contact with a tree) through the use of current measurements that match a particular pattern that has been observed. In order to localize the location of a broken and/or arcing conductor, there must be sensing devices on both sides of the event, and the location of the detectable event is only known to be somewhere between the two devices.

A radar (radio detection and ranging) system emits a known radio frequency signal into a medium (typically air) in order to determine the distance to objects of interest. Reflections of the radar signal occur when the medium through which the radar signal is propagating changes (e.g. from air to a solid object). When a radar signal encounters a medium change, some of the energy in the incident radar signal is typically reflected back toward the originating source of the signal. The time between the emission of the signal and the reception of the reflected signal, as well as the direction of the transmitted and reflected energy, can be utilized to determine the position of objects causing the reflections.

Radar imaging combines radar returns focused in spatially unique directions in order to create an image based on the reflections. This image can be referred to as a map.

When radar signals encounter a medium change, not all of the energy is reflected. Some energy is absorbed, some reflects, and some continues to propagate in the original direction. The energy that continues to propagate in the original direction may, in turn, be reflected by yet another medium change, and thus it is possible with radar to "see through" or image through objects.

A Time Domain Reflectometer (TDR) uses principles similar to those employed in radar except that the medium through which the emitted signals travel is a conductor. If a signal is injected into an ideal conductor having a characteristic impedance Z that is terminated at its end by a load having the characteristic impedance Z, there will be no reflected signals. These conditions rarely, if ever, exist under real-world conditions, where impedance discontinuities along the cable-to-load impedance mismatches are common. A TDR system measures signal reflections from impedance discontinuities and the cable-to-load impedance mismatches along a conductor. In order to measure those reflections, the TDR will transmit an incident signal onto the conductor and listen for its reflections. If the conductor is of uniform impedance and does not have terminations or splits, there will be no reflections and the remaining incident signal will be absorbed at the far end by the termination. However, if there are impedance variations, some of the incident signal will be reflected back to the source. A TDR is similar in principle to radar [https://en.wikipedia.org/wiki/Time-domain_reflectometer].

The reflection coefficient (the amount of energy that is reflected by a discontinuity in the transmission medium) is the ratio of energy that returns relative to the incident energy. This is often called the impedance change or impedance mismatch.

Impedance mismatches are defined as metal-to-metal contacts on a conductor that have an impedance value that is different from the original conductor. When a TDR signal that is tuned to the conductor impedance is applied to the contact, a portion of that energy will be reflected back to the source of the signal. As noted in U.S. Patent Publication 20160124449 (Heenan, Abbott, Ragsdale) a reflection in a conductor may be an incidental high-impedance reflection point.

In power engineering, measurement of unexpected impedance values is a classic way to determine faults in a metallic conductor. When impedance measurements return unexpected values that indicate the possibility of a problem, they are referred to as impedance faults.

Spread Spectrum Time Domain Reflectometry (SSTDR) is a measurement technique that has been used to identify faults, usually in electrical wires, by observing reflected spread spectrum signals. This type of time-domain reflectometry can be used in various high-noise and live environments. For accurate location of a fault in a wiring system, the SSTDR associates the pseudo noise (PN) code [or spreading signal] with the signal on the utility power line then stores the exact location of the correlation before the arc dissipates [https://en.wikipedia.org/wiki/Spread-spectrum_time-domain_reflectometry].

BRIEF DESCRIPTION

A method for locating an anomaly in a power distribution circuit includes transmitting various RF signals (chirps) into the system; receiving RF signals reflections to identify locations of system components; and to continuously compare received signals to identify at least the location of at least one object other than the original system components of the power distribution circuit.

In one embodiment, a method for locating an anomaly in a power distribution circuit, includes utility power lines with a radio frequency energy source coupled to the utility power lines; transmitting chirped RF signals into the utility power lines from the radio frequency energy source; receiving and analyzing signal reflections from impedance mismatches caused by components and features connected to the utility power lines comprising the distribution circuit; and, generation of a reference data set identifying at least the locations of at least some of the components and features of the power distribution circuit. After the reference data set is generated, the system continuously monitors by transmitting chirped signals into the utility power lines from the radio frequency energy source, analyzing reflections from the sets of chirped signals by impedance mismatches in the power distribution circuit, and comparing the sets of analyzed signals with the reference data set to determine if there is at least one anomaly on the power distribution circuit.

According to aspects of the invention, a voting scheme is used for each point in the enveloped signals and is calculated from the multiple iterations of each unique chirp from the suite of signals. The results of the voting scheme based on the enveloped signals are saved to file. Once the system has saved a sufficiently large data set of voting scheme results from the time independent suite of signal recordings, the mapping baseline is calculated. The mapping baseline is compared with the single line diagram to determine which portion of the enveloped signals matches with a particular piece of equipment. The anomaly detection process of the present invention is performed for each phase being monitored.

The transmitted suite of signals is cross-correlated with the reflected suite of signals. The cross-correlated signals are enveloped. A voting scheme is used for each point in the enveloped signals and is calculated from the multiple iterations of each unique chirp from the suite of signals. The results of the voting scheme, based on the enveloped signals, are saved to a file. Once the system has saved a sufficiently large data set of voting scheme results from time independent suites of signal recordings, the comparison baseline is calculated. The transmitted and reflected suite of signals are analyzed and compared to the baseline. The comparison between the baseline and the newest data set determines if an anomaly exists. If no anomaly is detected, the new data set is added to the baseline signature. The oldest data set in the baseline is discarded. If an anomaly is detected, the anomalous data points are output and the newest data set is not added to the baseline signature. The anomalous data points are used to calculate the distance to the location of the anomaly.

Using the methodology described for applying an electrical signal and detecting reflection signals on a conductor as a foundation, the methods described by this invention map all impedance points within a conductor using a selection of waveform signals designed specifically for impedance mismatch reflection detection, processes it to create a map of the distribution circuit; and, then periodically interrogates the utility power line and compares those reflection patterns to the map to look for anomaly high-impedance reflection points indicative of a high-impedance fault.

The present invention does not require knowledge of how anomalous conditions act and is therefore able to detect a larger range of anomalous conditions on electrical conductors. The present invention is also able to detect and localize high-impedance faults with only one device since the system maps signals created by the present invention to the known electrical conductors. There are currently no devices that map electrical distribution circuits for localization of anomalous conditions, which is an aspect of the present invention.

While high-impedance fault detection is the primary goal of the present invention, it is also capable of detecting other anomalous conditions on the distribution circuit, such as moved or rerouted utility power lines, illegal power taps, switch changes, failing equipment, and other events that represent a change to the existing map of reflections caused by impedance mismatches on the utility power line. One potential use of the present invention could be to validate the completeness and accuracy of Geographical Information System (GIS) maps of the distribution circuit. Another use of the present invention could be in the detection of illegal taps in the distribution circuit. A further use of the present invention could be in detecting health changes of distribution circuit equipment indicative of an impending failure.

BRIEF DESCRIPTION OF THE DRAWING FIGURES

The present invention will be explained in more detail in the following with reference to embodiments and to the drawing in which are shown.

DETAILED DESCRIPTION

Persons of ordinary skill in the art will realize that the following description of the present invention is illustrative only and not in any way limiting. Other embodiments of the invention will readily suggest themselves to such skilled persons.

The present invention is an anomaly detection system and method using Spread-Spectrum Time-Domain reflectometry (SSTDR) techniques that can identify anomaly (high) impedances on utility power lines and determine where they are occurring.

Figure 1:
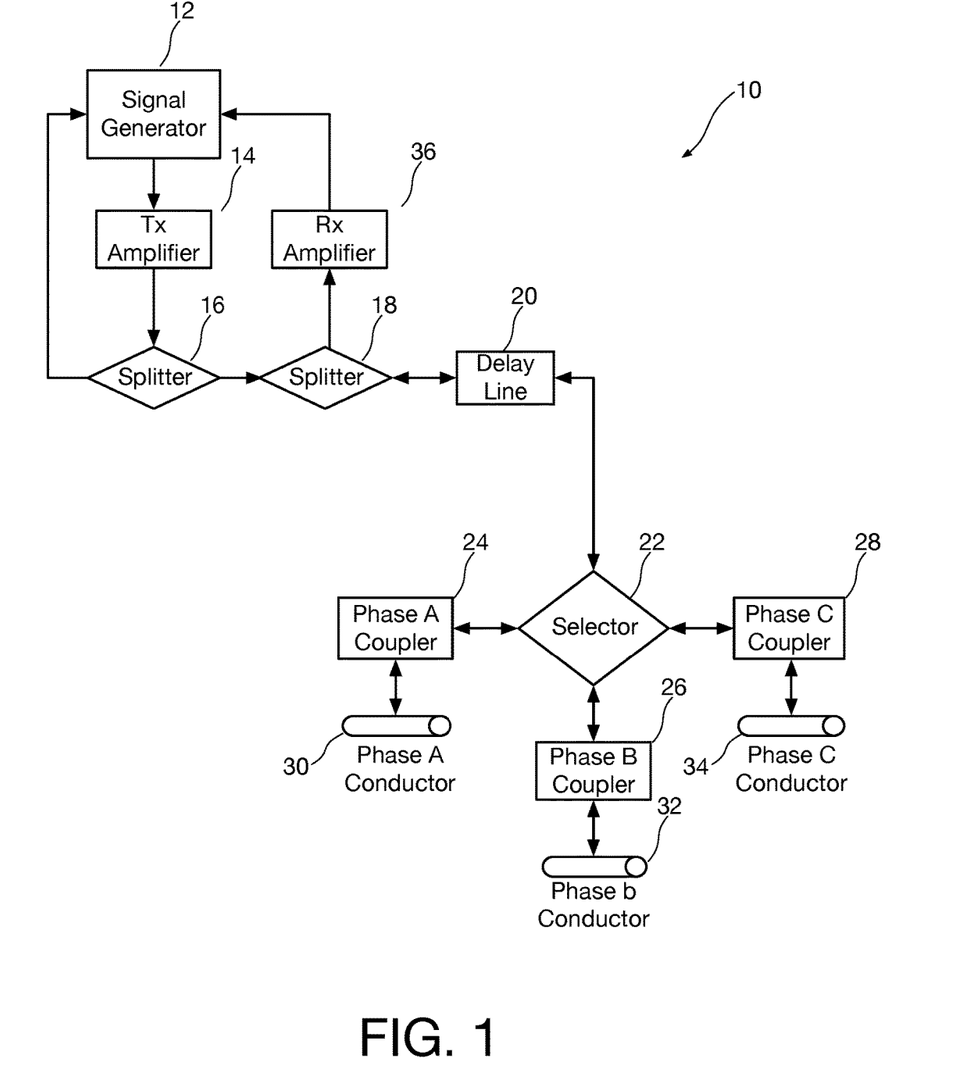
FIG. 1 is a block diagram of an exemplary high-impedance fault detection system in accordance with one embodiment of the invention.

Referring first to FIG. 1, a block diagram shows an exemplary high-impedance fault detection system 10 in accordance with one embodiment of the invention. A signal generator, one non-limiting example being a software-defined radio (SDR) 12, is used for signal generation and acquisition. One non-limiting example of a signal generator suitable for use in the present invention is a PicoScope 5000.

Spread spectrum signals can also be designed in embedded controller and sent to an arbitrary waveform generator (such as, but not limited to, a model PicoScope 5000 arbitrary waveform generator available from Picotech of Cambridgeshire, United Kingdom) for transmission.

RF chirp signals generated by the signal generator 12 are amplified by an RF amplifier 14 for outbound signal amplification. A ZHL-3A amplifier available from Mini Circuits has been found to be suitable to use for this purpose in the present invention although persons of ordinary skill in the art will appreciate that other models available from other manufacturers can be used as RF amplifier 14 in the present invention.

The outbound transmitted and amplified chirp signal can be split off using a directional coupler 16, part of the signal being fed back to the signal generator 12. The outbound transmitted and amplified signal is coupled to a delay line 20. The purpose of delay line 20 is used to provide a time delay that is, at the minimum, as long as the longest transmitted chirp signal that will be transmitted. In this manner, the entire chirp will be transmitted before it hits the first reflection point (at a capacitive coupler to be described further herein). The signal transmission line must have low signal attenuation (preferably <5 dB/100 ft @ 100 MHz). A length of coaxial cable such as Times Microwave LMR-240 cable is suitable for use as delay line 20 in the present invention.

The signal is then coupled to a 4-way switch 22 to direct it to the desired phase of a 3-phase distribution circuit. A Mini Circuits MSP4TA-18+ digitally controlled switch that may be controlled by using digital output channels of the signal generator 12 to control solid Power Field Effect Transistor (FET) switches to connect appropriate driving voltages (e.g., 24V) to the appropriate terminals on the digitally controlled switch 22 has been found to be suitable for this purpose. The switch 22 directs the RF chirp signal to one of three capacitive PLC/BPL couplers 24, 26, 28, or ground. Coupler 24 couples the signal into phase-A, conductor 30. Coupler 26 couples the signal into phase-B, conductor 32. Coupler 28 couples the signal into phase-C, conductor 34. The distance between directional couplers and the capacitive couplers is long enough to eliminate need for dead time on receivers through the use of delay lines. Capacitive couplers are useful because they isolate the low frequency, high voltage of the utility power line from the device, but allow high frequency chirp reflection signals to pass through.

Capacitive couplers such as comART Overcap-X-36 capacitive couplers available from Arteche have been found to be suitable for use in the present invention. The comART Overcap-X-36 couplers are a capacitive coupling solution that is used to inject and recover signals to and from utility power lines. They are standard, off-the-shelf products that are designed for energized utility power line use, perform impedance matching between processing equipment and the utility power line, provide electrical isolation from the utility power line, can be hung directly on the utility power line by using a hot line clamp and are rated for outdoor service use. These couplers have small insertion losses (<3 dB) in all frequency ranges used by the system (2-40 MHz). They are rated for utility power lines up to 38 kilo-Volts (kV). Persons of ordinary skill in the art will readily be able to select capacitive couplers or other couplers suitable for particular applications of the present invention, and appreciate that other injection methods may be employed. Persons of ordinary skill in the art will also appreciate that the system of the present invention may be used with a power distribution circuit in an un-energized state.

The transmitted chirped signals reflect at each impedance mismatch along the utility power line. The reflected signals travel back through the same capacitive coupler used for the original signal transmission. Reflected signals from the Phase-A, Phase-B, and Phase-C utility power lines 30, 32, and 34 travel back through the capacitive couplers 24, 26, and 28, delay line 20, directional coupler 18, and a low-noise, variable-gain receive amplifier, before they are acquired by the signal generator 12. A receive amplifier is used to amplify the received signals. For this, the low-noise, variable-gain AD8332 amplifier available from Analog Devices has been found to be suitable for this purpose. The gain of this amplifier can be dynamically adjusted in order to provide the optimal signal voltage level to the signal generator 12, which should be as close to its full-scale voltage as possible in order to efficiently utilize the vertical range of the RF input of signal generator 12. Using variable gain amplifiers allows the system to be tuned to the utility power line to be monitored in order to maximize the use of the bit resolution of the digitizers in the signal generator 12. If this condition is not met, the system will lose signal precision due to the reflected signals either being too small and not utilizing the entire bit range or being too large and clipping by exceeding the input range of the digitizers in the signal generator 12.

In accordance with one aspect of the present invention, a SSTDR signal can be operating as a non-limiting example, at frequencies between 2 Mhz-40 Mhz is injected into the utility power line at a known starting point. The particular embodiment disclosed herein can work with a wider frequency spectrum with the use of different utility power line coupling equipment. A suite of signals are transmitted by the system of the present invention. The suite of signals is composed of several unique signals, and each unique signal is transmitted multiple times with enough delay time between transmissions so that no overlap occurs between reflections and transmissions.

A portion of the signal will be reflected back to the origin wherever it hits an impedance mismatch. Reflections are mapped to a known "good" map, where the system can look for reflections that do not map to a known object. The system and method look for impedance mismatches that are not a part of the normal utility power line construction. The system and method can provide telemetry to a management system(s) (e.g. DMS or OMS) for visual feedback of detected anomaly to operations. The system and method are capable of being triggered by management system(s) (e.g. DMS or OMS) to account for circuit topology changes.

The system performs a calibration phase where it captures a reflection sequence of the circuit when it does not have any anomaly (high) impedance conditions and correlates that reflection sequence to a GIS map of the circuit. This identifies all known objects on the distribution circuit and produces the known "good" map in a dynamic manner, repeated periodically. In one embodiment of the invention, a rolling average is kept of the reflected signals, the oldest set of signals in the average being replaced by the newest set of reflected signals. In this way, the effects of portions of reflected signals representing transient events can be minimized.

The mapping algorithm of the present invention is described below in a step-wise fashion for a single phase of the distribution circuit. Persons of ordinary skill in the art will appreciate that this algorithm is performed for each phase of the distribution circuit being monitored by the present invention.

Persons of ordinary skill in the art will appreciate that a fundamental requirement necessary for initialization of the present invention is a priori knowledge of the electrical utility power line with which the present invention will be used. Before system operation is initiated it must be known that the utility power line is configured to specifications, is operating properly, and that no anomalous conditions are present. If this requirement is not met, then the present invention will detect any clearing of the anomalous condition as an anomaly itself and/or attribute a reflected signal to an incorrect physical location due to improper system configuration reports.

Before any anomaly can be detected, a reflection map is built. A data model map is based on present geographic information system (GIS) data. Training signals are sent down the utility power line to confirm where normal mismatches are expected to occur due to the presence of known objects and other artifacts of the utility power line. Reflections received are correlated to the data model map and are adjusted to map accurate distances to these objects and artifacts, and to account for multiple taps disposed at identical locations. The system creates a reflection map of the circuit of the power distribution circuit that shows where expected mismatches occur.

A map is prepared for anomaly localization. The reflection map is flattened into a one-dimensional array. Peaks and valleys are predicted, where peaks correspond to equipment and valleys correspond to utility power line splits. The amplitudes of the peaks and valleys are then adjusted according to reflected signal strength to create a prediction signal that can be used for correlation. Following this process provides a prediction of where all known (good) impedance mismatches should be in the circuit, validated with actual signal reflections.

Figure 2:
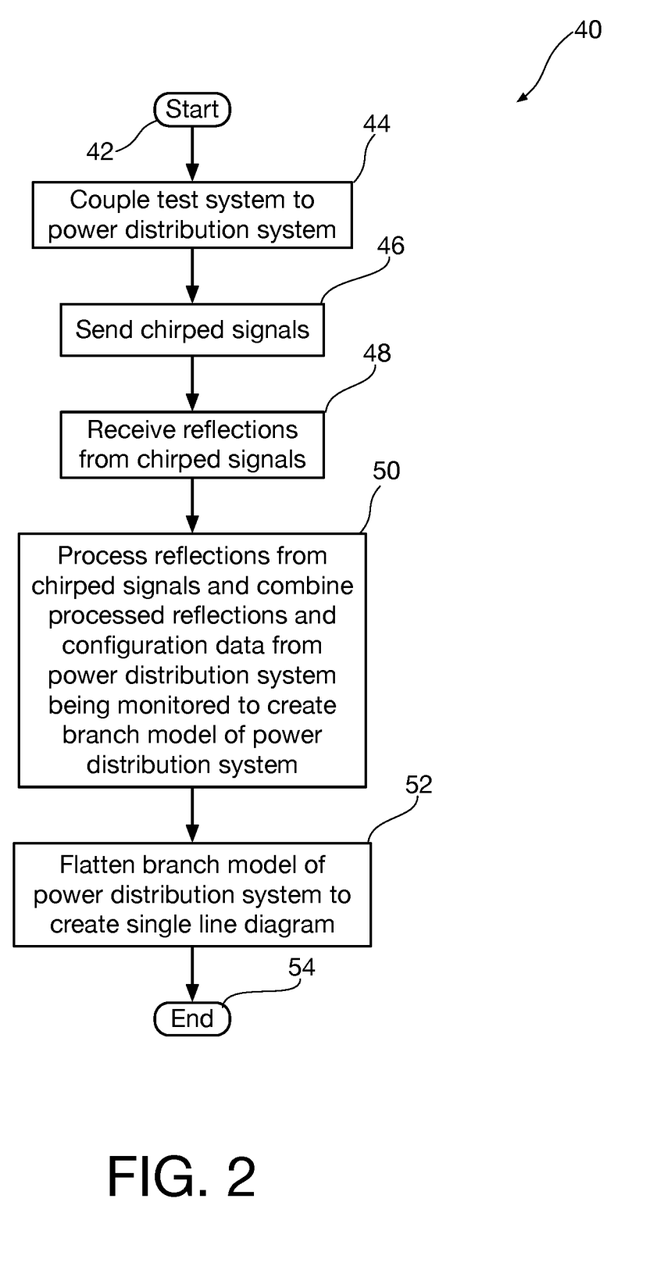
FIG. 2 is a flow diagram showing an illustrative process for configuring the system of the present invention to produce a known "good" map of the power distribution circuit being analyzed.

Referring now to FIG. 2, an illustrative process 40 for creating the known good map is shown. The process begins at reference numeral 42.

At reference numeral 44, the test system is coupled to the utility power line to perform signal injection and reflection detection. As noted with reference to FIG. 1, this may be accomplished using capacitive couplers on each phase of the utility power line conductors to be analyzed.

At reference numeral 46, chirped signals are injected into the utility power line. The signals transmitted by the system are preferably a suite of discrete signals with a frequency range that coincides with the couplers. Capacitive couplers such as comART Overcap-X-36 capacitive couplers allow for a frequency range of 2-40 MHz. Persons of ordinary skill in the art will readily be able to adjust the suite of signals depending on the particular couplers that are employed. The suite of signals is composed of several unique signals (for example, different frequencies, amplitudes, etc.), and each unique signal is transmitted multiple times with enough time between transmissions so that no overlap occurs between reflections and transmissions.

At reference numeral 48 reflections from those injected chirped signals are received by the test system.

At reference numeral 50 the reflections from the chirped signals are processed/analyzed and the processed reflections are combined with configuration data from the distribution circuit being monitored to create a branch model of the utility power lines or distribution circuit. At reference numeral 52 the branch model of the distribution circuit is flattened to create single line diagram of the distribution circuit. Each piece of equipment from the configuration data is placed in the branch model with a location based on the reference location of the signal injection couplers of the present invention.

According to one aspect of the present invention, the transmitted suite of signals is cross-correlated with the reflected suite of signals. The cross-correlated signals are enveloped. A voting scheme may be used for each point in the enveloped signals and is calculated from the multiple iterations of each unique chirp from the suite of signals to minimize errors caused by transient signals injected into the utility power line from random external sources. The results of the voting scheme based on the enveloped signals are saved to file. Once the system has saved a sufficiently large data set of voting scheme results from the time independent suite of signal recordings, the mapping baseline is calculated and flattened. The mapping baseline is compared with the single line diagram to determine which portion of the enveloped signals matches with a particular piece of equipment.

Figure 3:
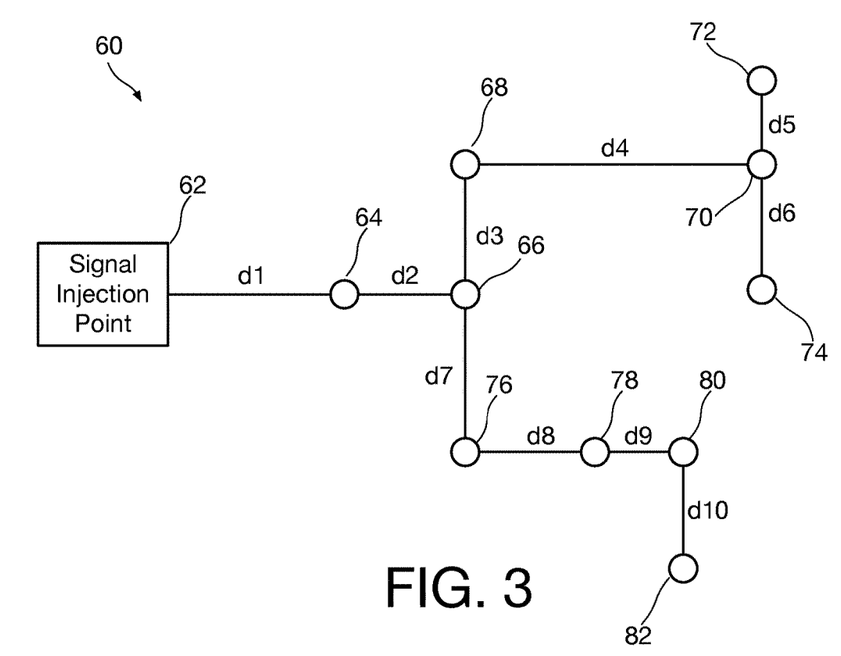
FIG. 3 is an illustrative branch map of a simplified power distribution circuit that illustrates one aspect of the present invention.

Referring now to FIG. 3, a simplified representation of a branch model 60 of the distribution circuit is shown. This branch model is for a small system, but is detailed enough to demonstrate the principles of the present invention. Branch model 60 is generated by combining system architecture information concerning of the power system with the reflected chirped signals. The location of the signal injection point 62 is the systems reference point for all equipment and features (collectively referred to herein as "objects") on the distribution circuit represented in FIG. 3 as circles. As will be appreciated by persons of ordinary skill in the art, the objects that may be encountered on a utility power line take numerous forms but all possess the property that they will represent impedance mismatches and will therefore reflect some of the energy from the chirped signal.

The first object encountered on the utility power lines is object 64. This object 64 is generalized to be any feature of the distribution circuit and is located at a distance d1 from the signal injection point 62. The second object encountered on the utility power lines is object 66, which is a branch in the distribution circuit located at a distance d2 from the object d1. In a first direction from the branch 66, object 68 is located at a distance d3 from object 66. Object 70 is located at a distance d4 from object 68 and is also a branch. Object 72 is located at a distance of d5 in a first direction from branch object 70 and object 74 is located at a distance of d6 in a second direction from branch object 70. Objects 72 and 74 are at the end of their respective branches.

In a second direction from the branch 66, object 76 is located at a distance d7 from object 66. Object 78 is located at a distance d8 from object 76. Object 80 is located at a distance of d9 from object 78 and object 82 is located at a distance of d10 from object 80. Object 82 is at the end the second branch of branch object 66.

The processing that occurs at reference numeral 50 of FIG. 2 compares and correlates the known distances of the objects 64 through 82 from the signal injection point 62 with the reflections received from the chirped signals. The comparison and correlation takes into account the nature of the reflections from classes of objects on the system. For example, the reflected signal will include peaks and valleys, where peaks correspond to equipment and valleys correspond to utility power line splits. The amplitudes of the peaks and valleys are predicted from the map of FIG. 3 and then adjusted according to reflected signal strength to create a prediction signal that can be used for correlation.

Figure 4:
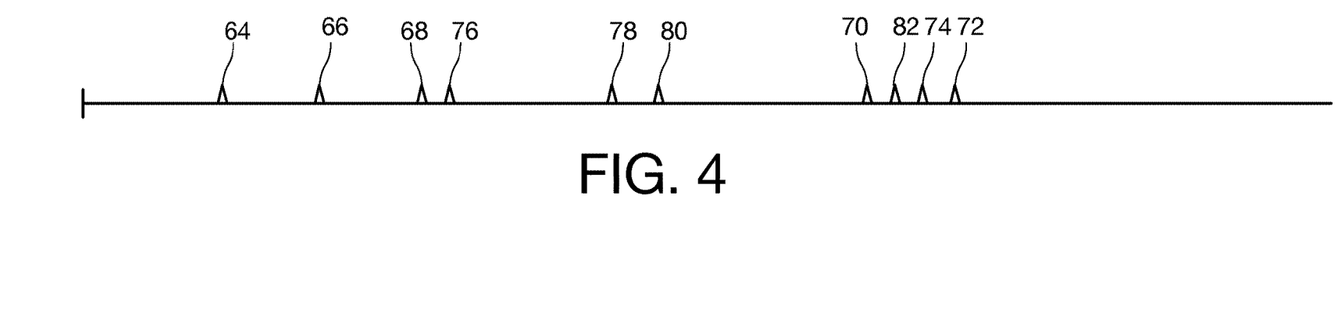
FIG. 4 is an illustrative flattened one-dimensional map of the simplified power distribution circuit of FIG. 3.

The processing that occurs at reference numeral 52 of FIG. 2 flattens the map of FIG. 2 into a linear one-dimensional map as shown in FIG. 4. By comparing the reflected signal and the map of FIG. 3 the locations of the objects 64 through 82 are confirmed. Object 64 is located at a distance d1 from the signal injection point 62. Object 66 is located at a distance (d1+d2) from the signal injection point 62. Object 68 is located at a distance (d1+d2+d3) from the signal injection point 62. Object 76 is located at a distance (d1+d2+d7) from the signal injection point 62. Object 78 is located at a distance (d1+d2+d7+d8) from the signal injection point 62. Object 80 is located at a distance (d1+d2+d7+d8+d9) from the signal injection point 62. Object 70 is located at a distance (d1+d2+d3+d4) from the signal injection point 62. Object 72 is located at a distance (d1+d2+d3+d4+d5) from the signal injection point 62. Object 74 is located at a distance (d1+d2+d3+d4+d5+d6) from the signal injection point 62. Following this process gives a prediction of where all known "good" impedance mismatches should be in the mapped circuit of the distribution circuit, validated with actual signal reflections. The correlated reflection signal represents the topology of the distribution circuit when it is in a known "good" state and is saved for comparison with later-generated reflection signals when the system is operated in a diagnostic mode.

After the known "good" map is created, the system then regularly injects chirped signals into the distribution circuit and compares reflections to the correlated reflection map to identify any anomalies. Changes to the distribution circuit configuration can be identified as anomalies. High-impedance faults are only one type of anomaly that the system of the present invention can identify. The system of the present invention is also capable of detecting other conditions based on its mapping of the reflections, such as utility power line configuration changes, switch changes, unmapped or illegal utility power line taps, or deteriorating splices, all of which are indicated by changes to the known reflection map. If any abnormalities are found, the system determines and reports the location of the anomaly to enable inspection of the location of the abnormality by a maintenance crew or to update the known "good" map in the event the abnormalities are caused by newly-installed authorized components or features.

Figure 5:
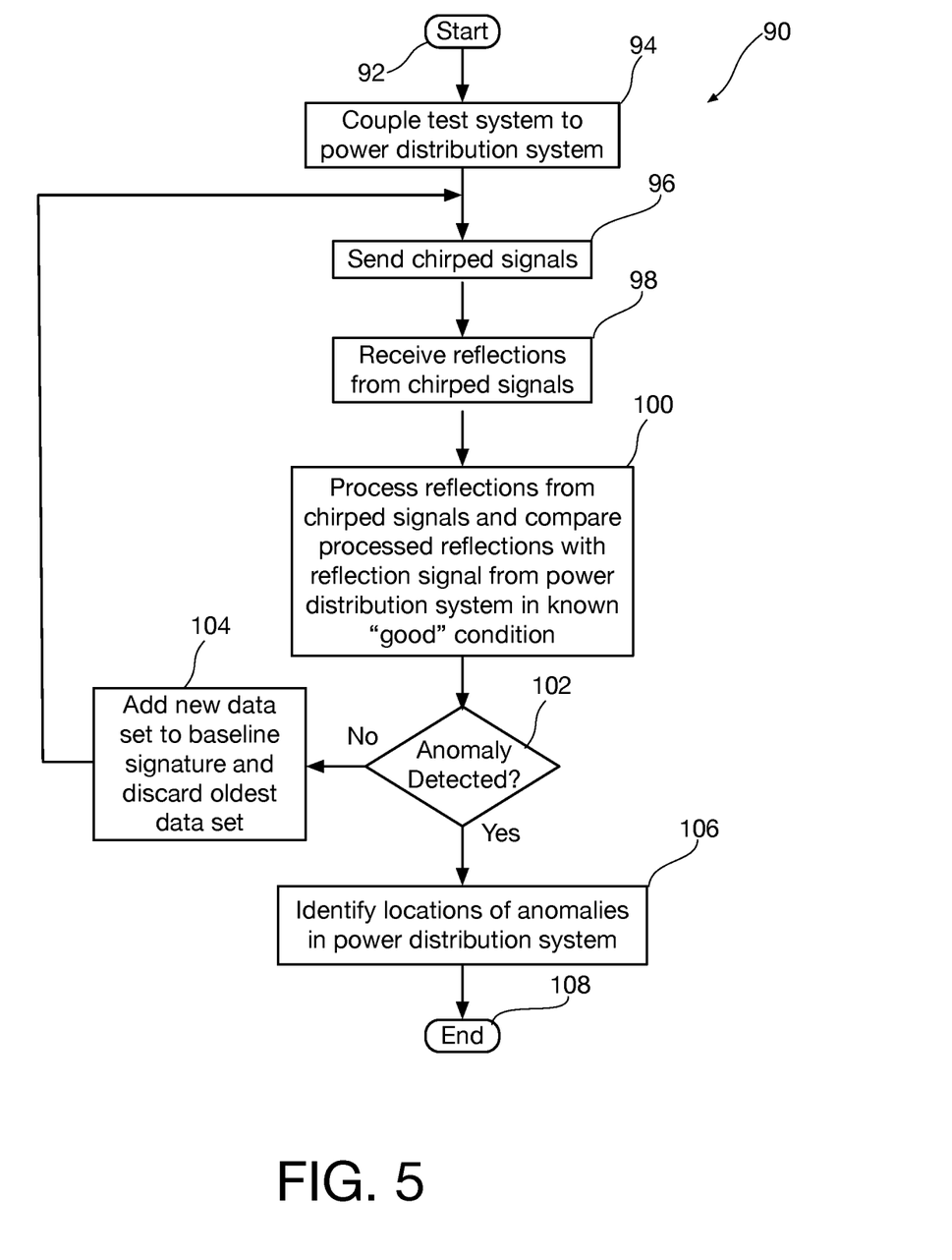
FIG. 5 is a flow diagram showing an illustrative process for using the system of the present invention to perform diagnostic fault testing of the power distribution circuit being analyzed.

Referring now to FIG. 5, a flow chart shows an illustrative process 90 for detecting anomalies on a distribution circuit. An illustrative anomaly detection algorithm of the present invention is described below in a step-wise fashion for a single phase of the electrical utility power line. This algorithm occurs for each phase being monitored by the system.

The process begins at reference numeral 92. At reference numeral 94, the test system is coupled to the utility power line to perform signal injection and reflection detection. As noted with reference to FIG. 1, this may be accomplished using capacitive couplers on each phase of the utility power line conductors to be analyzed. Persons of ordinary skill in the art will appreciate that the capacitive or other couplers may be coupled to the utility power line for an indefinite period of time in which case this step need not be performed each time a diagnostic procedure is executed.

At reference numeral 96, chirped signals are injected into the distribution circuit and at reference numeral 98 reflections from those injected chirped signals are received by the test system.

At reference numeral 100 the reflections from the chirped signals are processed and the processed reflections are compared with the stored reflection signal that was obtained when the system was in a known "good" state to detect changes in the distribution circuit. A rolling average algorithm may be used.

According to one embodiment of comparison process used in the present invention, the transmitted suite of signals is cross-correlated with the reflected suite of signals. The cross-correlated signals are enveloped. A scheme is used for each point in the enveloped signals and is calculated from the multiple iterations of each unique chirp from the suite of signals. The results of the voting scheme, based on the enveloped signals, are saved to a file.

Once the system has saved a sufficiently large data set of voting scheme results from time independent suites of signal recordings, the comparison baseline is calculated. The transmitted and reflected suite of signals that is processed after the baseline is computed and compared to the baseline. The comparison between the baseline and the newest data set determines whether an anomaly has occurred.

At reference numeral 102, it is determined whether an anomaly has been detected. If no anomaly is detected, the process proceeds to reference numeral 104, where the newly acquired data set is added to the baseline signature and the oldest data set in the baseline is discarded. If an anomaly is detected, the process proceeds to reference numeral 106. According to one particular embodiment, the anomalous data points are output. The newest data set containing the anomaly data is not added to the baseline signature. The anomalous data points are used to calculate the distance to the location of the anomaly.

Figure 6:
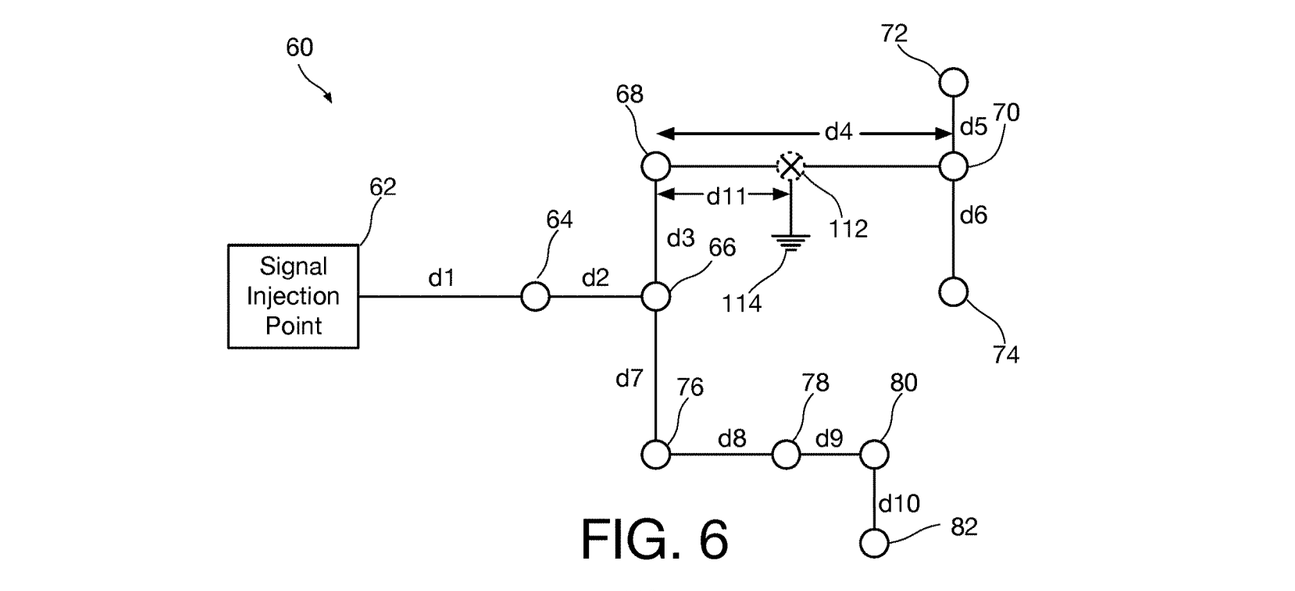
FIG. 6 is an illustrative branch map of a simplified power distribution circuit containing a high-impedance fault that illustrates one aspect of the present invention.
Figure 7:
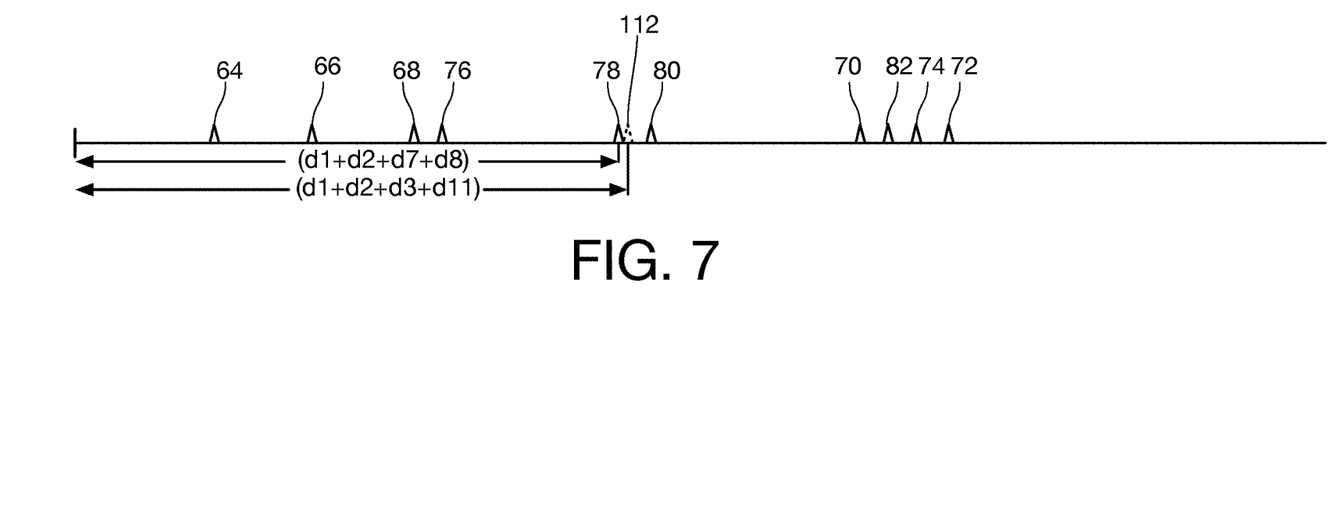
FIG. 7 is an illustrative flattened one-dimensional map of the simplified power distribution circuit of FIG. 6.

Referring now to FIG. 6, a simplified representation of the branch model 60 of the distribution circuit of FIG. 3 is shown having a high-impedance fault (object 112 in the form of a short circuit to ground 114) located at a distance d11 past object 68. As shown in FIG. 7, object 112 appears as an object on the flattened map of FIG. 4.

Figure 8:
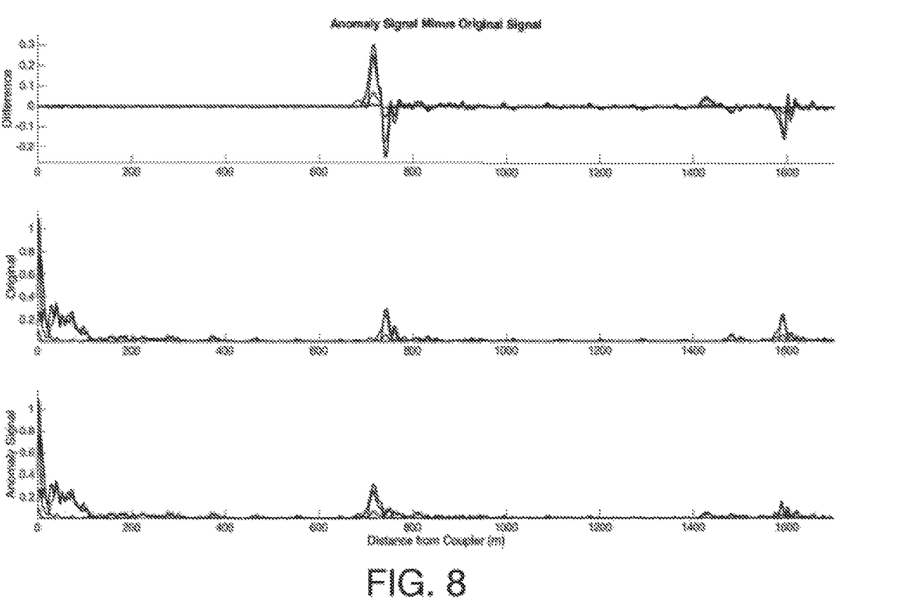
FIG. 8 is a representation of a set of data curves in which a comparison is made between the baseline and an anomalous data set.

A comparison between the baseline and an anomalous data set is shown in FIG. 8. The center plot is the running average of the original known good reflection signal. The bottom plot is the running average of the anomaly reflection signal. The top plot is the difference between the center and bottom plots and clearly shows the anomaly. The anomalous data set of the top plot has an additional reflection point that is not consistent with normal system parameters. The x-axis of the FIG. 8 curves shows the distance from the signal injection point at which the reflection signals occur and identifies the location where the anomaly is occurring.

This new event also causes the reflections beyond it to have less power to reflect, which is also used as an anomaly identifier. The use of different transmitted signals increases the rate of event detection due to reproducibility through diversity.

The persistence of an anomalous condition being detected discriminates between a transient error in the reflection signal of one set of chirped signals and an actual anomaly. Transient signals can be present on the return signal due to phenomena such as lightning, transmissions from a fixed or passing RF source, etc. As long as the anomalous event is occurring on the system, the system of the present invention is able to detect it. Transient events affecting the reflected signals may be effectively filtered out through the use of the implemented voting scheme that analyzes multiple signals.

In accordance with another aspect of the present invention, the anomaly is localized based on known good reflections that are received and reflections that were not received or that came back with different signatures. It is to be noted that reflections from anomaly impedance will have an effect on the reflection signature downstream of it, which aids in finding both distance to the anomaly and localization by branch. This is because the anomaly reflects energy that would normally travel further down the utility power line and be reflected by additional objects downstream of the anomaly. This can be seen by an examination of FIG. 6. The anomaly object 112 reflects a portion of the energy that would otherwise encounter objects 70, 72, and 74. As a consequence of the lower amount of energy encountering objects 70, 72, and 74, the reflections returning from these objects will be received with correct timing, but will be attenuated in amplitude. In other cases, reflections from downstream objects may simply be absent.

This consequence of anomaly reflection is useful to locate the anomaly by resolving possible ambiguities in the reflected signals. If assumed the possible distance (d1+d2+d3+d11) to the anomaly object (112) is the same, or very close to, the distance (d1+d2+d7+d8) of a legitimate object (78) as shown in FIG. 7, the time position in the reflected signals for both objects (112 and 78) will be the same. In accordance with one aspect of the present invention, the ambiguity can be resolved because the amplitudes of the reflections received from objects 80 and 82 will be as expected, while the amplitudes of the reflections received from objects 70, 72, and 74 will have a lower-than-expected amplitude, indicating an unexpected reflection upstream from these objects.

Spread spectrum signals are designed in an embedded controller and sent to an arbitrary waveform generator. In one implementation a National Instruments NI PXIe-5451 was used for transmission.

Digital or Analog signals are sent from the Analog and Digital Input/Output. In implementation a National Instruments NI PXIe-8135 was used to control the switch, and[. the gain of the amplifiers.

Spread spectrum signal is transmitted from device and amplified. In one implementation a Mini Circuits ZHL-3A RF amplifier was used.

A portion of the transmitted signal is coupled through a directional coupler. In one implementation a ZMDC-20-3+ was used and recorded by one channel of the digitizer. In one implementation a National Instruments NI PXIe-5122 Digitizer 1 was used. A plot showing a suite of recorded transmitted signals is shown in FIG. 8.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for locating an anomaly in a distribution circuit comprising utility power lines and components and features to the utility power lines, the method comprising the steps of:
   (1) coupling a radio frequency energy source to the utility power lines;
   (2) transmitting chirped radio frequency signals into the utility power lines from the radio frequency energy source;
   (3) receiving and digitizing/analyzing signals reflected from the chirped signals caused by components and features of the distribution circuit;
   (4) generating from the digitized signals of multiple sets of the chirped radio frequency signals a reference data set identifying at least the locations of at least some of the components and features of the distribution circuit;
   (5) after generating the reference data set, transmitting sets of the chirped radio frequency signals into the utility power lines from the radio frequency energy source;
   (6) receiving and digitizing signals reflected from the sets of chirped signals by impedance mismatches in the distribution circuit; and
   (7) comparing the digitized signals reflected from the sets of chirped signals in step (6) with the reference data set to determine if there is at least one anomaly in the distribution circuit.

2. The method of claim 1 further comprising:
   if it is determined in step (7) that there is at least one anomaly in the distribution circuit, identifying the location of the at least one anomaly.

3. The method of claim 2 wherein identifying the location of the at least one anomaly comprises identifying an artifact in the received digitized reflection signals positioned at a location in a time domain where no components and features of the distribution circuit are positioned, wherein the location of the artifact is other than in the components and feature of the distribution circuit.

4. The method of claim 2 wherein identifying the location of the at least one anomaly comprises identifying a component or feature of the distribution circuit from which at least one received reflection signal has an amplitude lower than predicted by the reference data set.

5. The method of claim 2 wherein identifying the location of the at least one anomaly comprises identifying a component or feature of the distribution circuit from which at least one expected reflection signal predicted by the reference data set no longer appears in the reflection signals.

6. The method of claim 1 wherein step (4) comprises combining the received reflected signals with known data identifying at least the physical locations of at least some of the components and features of the distribution circuit.

7. The method of claim 1 wherein generating the reference data set in step (4) comprises:
   generating a mapping baseline from data including digitized reflection signals from a plurality of received reflected signals;
   flattening the mapping baseline; and
   comparing the flattened mapping baseline with the reference data identifying at least the physical locations of the components and features of the distribution circuit to determine which portion of the enveloped signals matches with a particular one of the components and features of the distribution circuit.

8. The method of claim 1 wherein:
   step (7) occurs for each data set including a new plurality of received and digitized signals reflected from the chirped signals of step (6) to determine whether an anomaly has occurred;
   if no anomaly is detected, adding the new data set to the reference data set and discarding an oldest data set in the reference data set; and
   if an anomaly is detected, outputting anomalous data points and not adding the new data set to the reference data set.

9. The method of claim 1 wherein:
   step (7) occurs for each data set including a new plurality of received and digitized signals reflected from the chirped signals of step (6) to determine whether an anomaly has occurred;
   if an anomaly is detected in step (7), outputting anomalous data points;
   determining from the anomalous data points whether the anomaly represents a newly-added component or feature of the distribution circuit not in the reference data set;
   if the anomaly represents a newly-added component or feature of the distribution circuit, updating the reference data set to include at least the location of the newly-added component or feature of the distribution circuit; and
   if the anomaly does not represent a newly-added component or feature of the distribution circuit, designating the anomaly as an investigative item and not adding the new data set to the reference data set.

10. A method for locating an anomaly in a distribution circuit comprising utility power lines and components and features to the utility power lines, the method comprising the steps of:
    (1) coupling a radio frequency energy source to the utility power lines;
    (2) injecting a plurality of unique signals into the utility power lines from the radio frequency energy source;

(3) receiving and digitizing signals reflected from the plurality of unique signals caused by components and features of the distribution circuit;

(4) generating from the digitized signals of multiple sets of the unique signals a reference data set identifying at least the locations of at least some of the components and features of the distribution circuit;

(5) after generating the reference data set, transmitting sets of the unique signals into the utility power lines from the radio frequency energy source;

(6) receiving and digitizing signals reflected from the sets of unique signals by impedance mismatches in the distribution circuit; and (7) comparing the digitized signals reflected from the sets of chirped unique signals in step (6) with the reference data set to determine if there is at least one anomaly in the distribution circuit.

11. The method of claim 10 wherein each unique signal is transmitted multiple times with enough delay time between transmissions so that no overlap occurs between reflections and transmissions.

12. The method of claim 10 wherein the reference data set has a plurality of data points and each data point is calculated from multiple iterations of each chirp from the plurality of unique signals transmitted multiple times using a voting scheme to minimize errors caused by transient signals injected into the utility power line from random external sources.

13. A system for locating an anomaly in a distribution circuit comprising utility power lines and components and features to the utility power lines, the system comprising:
  a) a radio frequency energy source coupled to the utility power lines and controlled to transmit chirped radio frequency signals into the utility power lines; and
  b) a processor coupled to the utility power lines and configured to:
    i) receive and digitize signals reflected from the chirped signals caused by components and features of the distribution circuit;
    ii) generate from the digitized signals of multiple sets of the chirped radio frequency signals a reference data set identifying at least the locations of at least some of the components and features of the distribution circuit;
    iii) receive and digitize signals reflected from the sets of chirped signals by impedance mismatches in the distribution circuit; and
    iv) the digitized signals reflected from the sets of chirped signals in element b) iii) with the reference data set to determine if there is at least one anomaly in the distribution circuit.

* * * * *